(12) United States Patent
Lee et al.

(10) Patent No.: US 10,020,060 B2
(45) Date of Patent: Jul. 10, 2018

(54) ASYMMETRIC PASS FIELD-EFFECT TRANSISTOR FOR NONVOLATILE MEMORY

(71) Applicant: Cypress Semiconductor Corporation, San Jose, CA (US)

(72) Inventors: Sungkwon Lee, Saratoga, CA (US); Venkatraman Prabhakar, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/419,954

(22) Filed: Jan. 30, 2017

(65) Prior Publication Data

US 2017/0169888 A1 Jun. 15, 2017

Related U.S. Application Data

(63) Continuation of application No. 15/078,890, filed on Mar. 23, 2016, now Pat. No. 9,589,652.

(60) Provisional application No. 62/232,286, filed on Sep. 24, 2015.

(51) Int. Cl.
*G11C 16/04* (2006.01)
*G11C 16/14* (2006.01)
*G11C 16/26* (2006.01)
*G11C 16/10* (2006.01)
*G11C 16/08* (2006.01)
*H01L 27/11582* (2017.01)

(52) U.S. Cl.
CPC .......... *G11C 16/14* (2013.01); *G11C 16/0466* (2013.01); *G11C 16/08* (2013.01); *G11C 16/10* (2013.01); *G11C 16/26* (2013.01); *H01L 27/11582* (2013.01); *G11C 16/0433* (2013.01)

(58) Field of Classification Search
CPC . G11C 16/0483; G11C 16/10; G11C 16/0466; G11C 16/08; G11C 16/26; G11C 16/14; G11C 16/0433; G11C 16/24; G11C 5/025; G11C 11/56; G11C 11/5635; G11C 11/5642; G11C 15/046; G11C 16/3445
USPC ............ 365/185.17, 185.05, 185.18, 185.03, 365/185.11, 185.12
See application file for complete search history.

(56) References Cited

U.S. PATENT DOCUMENTS 7,123,500 B2  10/2006  Ye et al.
7,859,904 B1  12/2010  Jenne et al.
(Continued)

OTHER PUBLICATIONS

U.S. Appl. No. 15/078,890: "Asymmetric Pass Field-Effect Transistor for Nonvolatile Memory," Sungkwon Lee et al., filed Mar. 23, 2016 ; 40 pages.

(Continued)

*Primary Examiner* — Thong Q Le

(57) ABSTRACT

A method of performing an operation on a non-volatile memory (NVM) cell of a memory device is disclosed. The pass transistor of the NVM cell is an asymmetric transistor including a source with a halo implant. The source of the pass transistor is coupled to a common source line (CSL) that is shared among NVM cells of a sector of NVM cells. The operation may be performed by applying a first signal to a word line (WLS) coupled to a gate of a memory transistor of the NVM cell and applying a second signal to a bit line (BL) coupled to a drain of the memory transistor of the NVM cell.

20 Claims, 7 Drawing Sheets

(56) References Cited

U.S. PATENT DOCUMENTS

| | | | |
|---|---|---|---|
| 8,138,797 B1* | 3/2012 | Liu | H01L 21/324 |
| | | | 326/102 |
| 8,498,140 B2 | 7/2013 | Fossum et al. | |
| 8,542,541 B2 | 9/2013 | Hirose et al. | |
| 8,861,273 B2 | 10/2014 | Lue | |
| 8,958,248 B2 | 2/2015 | Duuren et al. | |
| 9,129,687 B2 | 9/2015 | Kurjanowicz | |
| 2010/0117160 A1 | 5/2010 | Jung et al. | |
| 2011/0199830 A1* | 8/2011 | Lee | G11C 16/0433 |
| | | | 365/185.18 |

OTHER PUBLICATIONS

Chee Boon Jiew, et al, "Development of a robust 2T-SONOS cell for embedded flash application," 2 pages, Feb. 25, 2016.
International Search Report for International Application No. PCT/US16/47840 dated Sep. 16, 2016; 3 pages.
Jonathan Yu, et al, "Leakage Current in DRAM Memory," IEEE Xplore Digital Library, 2 pages, Jun. 25, 2006.
USPTO Non-Final Rejection for U.S. Appl. No. 15/078,890 dated May 20, 2016; 8 pages.
USPTO Non-Final Rejection for U.S. Appl. No. 15/078,890 dated Aug. 5, 2016; 6 pages.
USPTO Notice of Allowance for U.S. Appl. No. 15/078,890 dated Oct. 21, 2016; 5 pages.
Written Opinion of the International Searching Authority for International Application No. PCT/US16/47840 dated Sep.. 16, 2016; 5 pages.

* cited by examiner

ASYMMETRIC PASS FIELD-EFFECT TRANSISTOR FOR NONVOLATILE MEMORY

RELATED APPLICATIONS

This application is a continuation of U.S. patent application Ser. No. 15/078,890, filed on Mar. 23, 2016, which claims the benefit of U.S. Provisional Application No. 62/232,286, filed on Sep. 24, 2015, the content of which is hereby incorporated by reference herein.

BACKGROUND

Non-volatile memory (NVM) devices are currently in widespread use in electronic components that require the retention of information when electrical power is unavailable. Non-volatile memory devices may include read-only-memory (ROM), programmable-read-only memory (PROM), erasable-programmable-read-only memory (EPROM), and electrically-erasable-programmable-read-only-memory (EEPROM) devices. Some memory arrays utilize transistors and gate structures which may include a charge trapping layer. The charge trapping layer may be programmed to store data based on voltages applied to or received by the memory array.

BRIEF DESCRIPTION OF THE DRAWINGS

The present disclosure is illustrated by way of example, and not by way of limitation, in the figures of the accompanying drawings.

DETAILED DESCRIPTION

Figure 1:
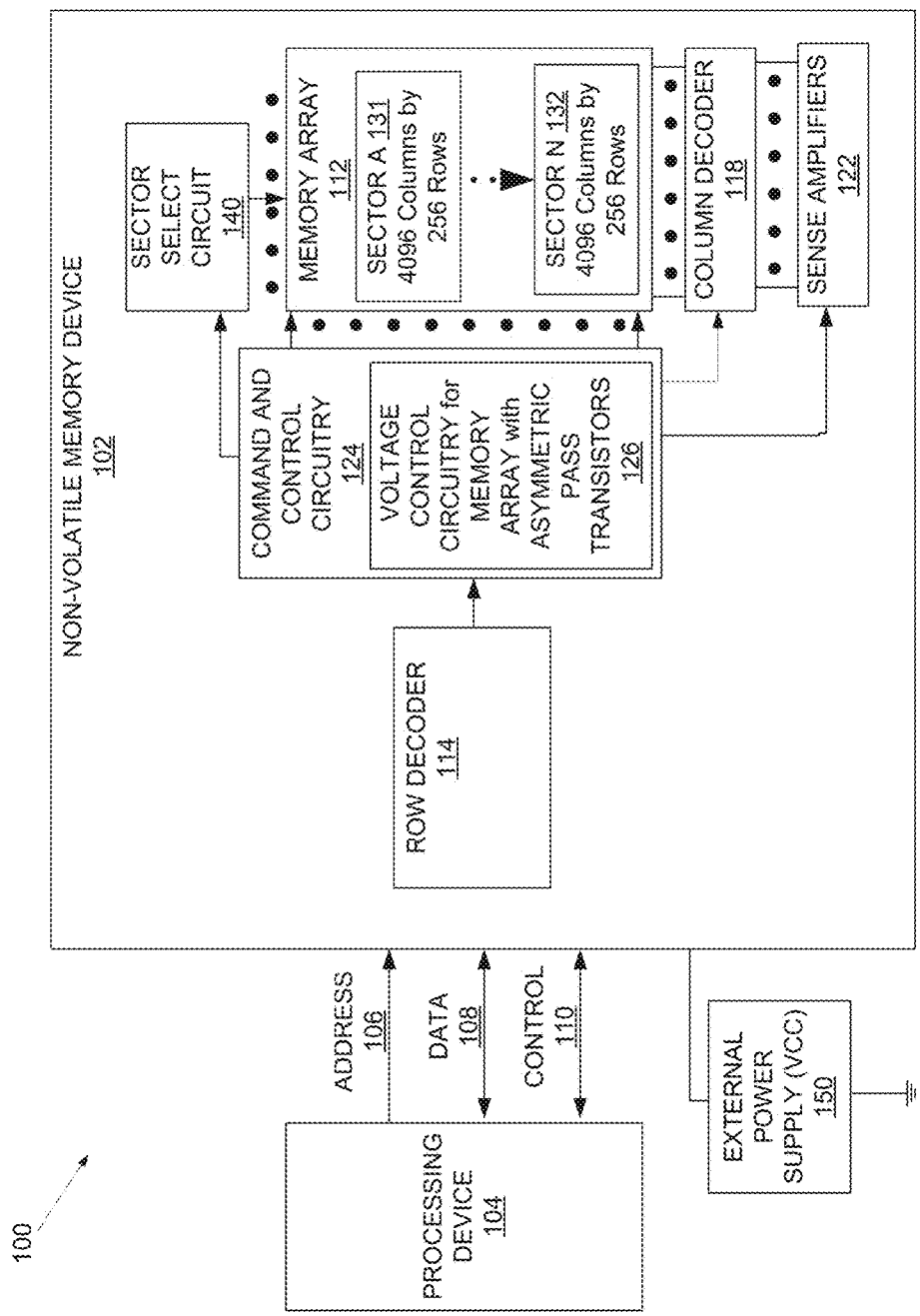
FIG. 1 is a block diagram illustrating a non-volatile memory system, according to an embodiment.

Voltage signals are used in the operation of non-volatile memory (NVM) devices, such as flash memory or phase-change memory. NVM devices may include one or more NVM cells. An NVM cell may be a unit of memory capable of storing a single data value (e.g., a single bit, such as a logical "0" or logical "1"). An NVM cell may, for example, be a two-transistor (2T) non-volatile memory (NVM) cell including a pass transistor and a memory transistor. A pass transistor may be a field-effect transistor (FET), such as a metal-oxide-semiconductor field-effect transistor (MOSFET), used as a switch to control voltage levels and or current levels at nodes of the NVM cell (e.g., at the source and or drain of pass transistor and or memory transistor). The memory transistor may be a transistor that stores a bit of binary information, for example by varying the charge stored in a charge trapping layer of the memory transistor.

Some NVM arrays may use dedicated source line (DSL) architecture. DSL architecture may include dedicated source lines for each column of NVM cells in an NVM array (or each column of NVM cells in an NVM sector of an NVM array). Common source line (CSL) architecture allows for shared source lines between multiple rows and/or columns of NVM cells. For example, CSL architecture may share a CSL between substantially all the NVM cells in a sector of NVM cells. In other examples, CSL architecture may share a CSL between substantially all the NVM cells in an NVM array. In another example, CSL architecture may share a CSL between two or more rows and or two or more columns of NVM cells in an NVM sector or array. The implementation of CSL architecture allows for a reduction of silicon area used for each memory cell.

A set of voltage differentials between the different terminals (e.g., gate to drain, gate to source, gate to well, or source to drain) may be applied to the transistors of an NVM cell of a memory device (NVM device) to perform different operations (e.g., pre-program, erase, program, and or read). The NVM device may implement a CSL shared between two columns of NVM cells of a NVM sector, for example. The set of voltage differentials between different terminals of the transistors of an NVM cell using CSL architecture may cause and or accentuate leakage currents (i.e., non-ideal and or undesirable current across regions and or terminals of a transistor, such as across the channel of a transistor). For example, during a programming operation (i.e., program the NVM cell to logical "1" or logical "0") on an NVM cell using CSL architecture, subthreshold leakage current ($I_{SubVt}$) from the source to the drain of the pass transistor may occur. Subthreshold leakage current may be current across the channel (e.g., between source and drain) of a transistor when the transistor is off (e.g., the voltage from gate to drain is below the voltage threshold (VT) of the transistor). The subthreshold leakage current may travel from the source of the pass transistor of an NVM cell through the channel of the pass transistor to the source of the memory transistor of the NVM cell, and from the source of the memory transistor through the channel of the memory transistor to the bit line, and from the bit line to the charge pump of the memory device. During the programming operation, a neighboring NVM cell sharing a CSL with the programmed NVM cell is inhibited (i.e., preventing an erased NVM cell (e.g., logical "0") from becoming programmed (e.g., logical "1") during a program operation). The inhibited cell may also have a leakage current, such as gate-induced drain leakage current ($I_{GIDL}$). Gate-induced drain leakage current may be leakage current in a transistor due to a large field effect at the drain junction of the transistor. Gate-induced drain leakage current may travel from the drain of the memory transistor of an inhibited NVM cell through the channel of the memory transistor to the drain of the pass transistor of the inhibited NVM cell, from the drain of the pass transistor to the well of the pass transistor, from the well of the pass transistor to the substrate, and from the substrate to a charge pump of the memory device. Some leakage currents, such as $I_{SubVt}$ and $I_{GIDL}$, may increase as the minimum feature size of the semiconductor process shrinks and transistors become smaller. Increased leakage currents may result in silicon area penalties (e.g., making the charge pump larger to compensate for sinking large leakage currents) and or reliability problems with NVM cells (e.g., shifting a VT of one or more transistors of an NVM cell). Additionally, designers often encounter trade-offs when reducing leakage currents. For example, designers may decrease the subthreshold leakage current by raising the VT of the pass transistor, which may increase gate-induced drain leakage current of a neighboring NVM cell.

The present disclosure addresses the above-mentioned and other deficiencies by performing an operation a two-transistor (2T) non-volatile memory (NVM) cell implemented using a CSL. The 2T NVM cell includes a memory transistor and an asymmetric pass transistor that has a source with a halo implant. During a program operation on the NVM cell using an asymmetric pass transistor, subthreshold leakage current across the programmed NVM cell may be reduced without increasing the gate-induced drain leakage current.

In one embodiment, a 2T NVM cell is coupled to a CSL shared with NVM cells of a sector of a memory device. A sector or NVM sector may be a block of an NVM array containing multiple of NVM cells (i.e., multiple rows of NVM cells and multiple columns of NVM cells). A memory array may include one or more sectors. The 2T NVM cell includes a memory transistor and a pass transistor. The pass transistor is an asymmetric transistor including a source with a halo implant. An asymmetric transistor may be a transistor that includes a source and a drain (or areas around the source and drain) that have different materials and or different amounts of a material. In one example, an asymmetric pass transistor has a source with a halo implant and a drain without a halo implant. In another example, an asymmetric pass transistor has a source with a strongly doped halo implant with an implant dose in the range of 1e13 to 1e14 atoms/cm$^2$ and a drain with a lightly doped halo implant with an implant dose in the range of 1e13 atoms/cm$^2$ or less. A halo implant (also referred to a "pocket implant") is an implant of a material surrounding, at least in part (e.g., below and or around and or to the sides), a region (e.g. source and or drain) of a transistor. The halo implant is a material with a conductivity type opposite of the region (e.g., p-type halo implant around n-type region). A halo implant may extend under part of the gate of a transistor and implantation of the halo implant may be performed after the gate of transistor has been formed.

In another embodiment, a program operation is performed on a 2T NVM cell that is coupled to a CSL shared with NVM cells of a sector of a memory device. The 2T NVM cell includes a memory transistor and a pass transistor. The pass transistor is an asymmetric transistor including a source with a halo implant. The halo implant at the source of the pass transistor is formed as part of a process step of a baseline fabrication process and no additional mask may be used. A baseline fabrication process (also referred to as "baseline logic process") may refer to standard semiconductor manufacturing process (e.g., process steps) and equipment associated with a particular semiconductor technology node (e.g., 65 nanometer (nm)). A process that deviates from a baseline fabrication process may add additional processing steps and or use additional masks. The NVM cell is a silicon oxide nitride oxide silicon (SONOS) memory cell. During the program operation, a first signal is applied to a word line (WLS) coupled to a gate of the memory transistor of the 2T NVM cell. A second signal is applied to a bit line (BL) coupled to a drain of the memory transistor of the 2T NVM cell and to a well line (SPW) coupled to a well of the memory transistor and a well of the pass transistor. The first signal and the second signal form a positive voltage potential between the gate and the drain of the memory transistor and between the gate and the well of the memory transistor, where the positive voltage potential programs the NVM cell. During the programming operation, the halo implant at the pass transistor reduces the subthreshold leakage current of the programmed NVM cell without increasing the gate-induced drain leakage current of the inhibited NVM cell that shares the CSL with the programmed NVM cell.

FIG. 1 is a block diagram illustrating a non-volatile memory system, according to an embodiment. NVM system 100 may include a processing device 104 coupled to NVM device 102 via address bus 106, data bus 108, and control bus 110. It will be appreciated by those skilled in the art that the NVM system 100 has been simplified for the purpose of illustration, and not intended to be a complete description. In particular, details of the processing device 104, row decoder 114, column decoder 118, sense amplifiers 122, and command and control circuitry 124, are not described in detail herein. It should be appreciated that NVM system 100 may include all, some, or more components than illustrated in FIG. 1.

External power supply 150, also referred to as power supply, is coupled to NVM device 102. External power supply 150 may be a power supply external to NVM device 102 and may be used by NVM device 102 to generate voltage signals, such as high voltage (HV) signals that are above the highest voltage of the external power supply 150 or below a lowest voltage of the external power supply 150 (e.g., ground voltage). For example, external power supply 150 may supply voltages from 0V to 1.2V. The HV signals may be below 0V or above 1.2V. For purpose of illustration, and not limitation, the following figures will be described as having an external power supply voltage of 0V to 1.2V, unless otherwise stated. It should be appreciated that different power supply voltage ranges may also be provided, for example 0V to 3V.

Processing device 104 may reside on a common carrier substrate such as, for example, an integrated circuit ("IC") die substrate, a multi-chip module substrate, or the like. Alternatively, the components of processing device 104 may be one or more separate integrated circuits and/or discrete components. In one exemplary embodiment, processing device 104 is the Programmable System on a Chip (PSoC®) processing device, developed by Cypress Semiconductor Corporation, San Jose, Calif.

Alternatively, processing device 104 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

NVM device 102 includes memory array 112, such as an NVM array, organized as rows and columns of non-volatile memory cells (not shown in this figure) as described below. Memory array 112 is coupled to row decoder 114 and/or command and control circuitry 124 via multiple select lines and read lines (at least one select line and one read line for each row of the memory array). Memory array 112 is further coupled to column decoder 118 via multiple bit lines 120 (one each for each column of the memory array). It will be appreciated that CSLs may be implemented as part of the multiple select lines and read lines and/or the multiple bit lines. Memory array 112 may be coupled to multiple sense amplifiers 122, via column decoder 118, to read multi-bit words therefrom. NVM device 102 further includes command and control circuitry 124 to receive signals from processing device 104 and sends signals to row decoder 114, control column decoder 118, sense amplifiers 122, control sector select circuit 140, and control voltage signals applied to memory array 112. Command and control circuitry 124 includes voltage control circuitry 126 for memory array 112 with asymmetric pass transistors to generate and control the voltage signals for operation of NVM device 102, which may be routed through voltage control circuitry 126 to column decoder 118, sense amplifiers 122, and/or sector selector circuit 140. Voltage control circuitry 126 operates to apply appropriate voltages, including HV signals and low voltage (LV) signals, to the memory cells during pre-program, erase, program, and read operations.

Command and control circuitry 124 may be configured to select a first row of memory array 112 for a program operation by applying a voltage to a first select line in the first row and to deselect a second row of the memory array by applying another voltage to a second select line in the second row. Command and control circuitry 124 may be further configured to control column decoder 118 to select a memory cell in the first row for programming by applying a voltage to a first bit line in a first column, and to inhibit an unselected memory cell in the first row from programming by applying another voltage to a second bit line in a second column. Command and control circuitry 124, in particular voltage control circuitry 126, may be further configured to apply a voltage to one or more common source lines that may be coupled to memory cells included in memory cell array 112 as described below.

NVM device 102 may be a storage device configured to store data values in various low-power and non-volatile contexts. For example, NVM device 102 may be included in a small area flash memory which may be implemented in devices or systems such as smart cards or bank cards. Accordingly, memory devices as disclosed herein, such as NVM device 102, may be implemented to have a relatively small area which may be fabricated using advanced processing nodes, such as a 65 nm node or lower. Moreover, as discussed in greater detail below, NVM device 102 may include various memory cells (not shown) configured to store data values. The memory cells may be implemented with a common source line to reduce the overall footprint of each memory cell. Each memory cell may also be compatible with Fowler-Nordheim programming techniques.

Memory array 112 may include one or more NVM sectors, such as sector A 131 though sector N 132. Each sector may have any number of rows and columns of NVM cells, for example 4096 columns and 256 rows. Rows may include multiple NVM cells arranged horizontally. Columns may include multiple NVM cells arranged vertically. Memory array 112 may use a global bit line (GBL) shared by all the sectors of memory array 112. Each column of memory array 112 may have a GBL. For example, a particular GBL for column 0 shared by all of the sectors (e.g., sector A 131 through sector N 132) will be coupled to each row of memory array 112 in column 0 of all the sectors. The GBL is configured to provide voltage signals to the sectors of memory array 112 during program operations and erase operation, but not during read operations.

Memory array 112 may use sector select circuit 140 to couple the GBL to an associated bit line (BL) of a column of a particular sector. Each column in a sector may have an associated BL particular to that sector that is not shared by other sectors. Each column in a sector may have a sector select circuit 140 to selectively couple the GBL to the associated BL. For example, a sector select circuit 140 for column 0 of sector A 131 may be used as a switch to couple the voltage signal on GBL of column 0 of memory array 112 to the BL for column 0 of sector A 131 during erase operations and program operations.

Memory array 112 may also use sector select circuit 140 to couple a column of NVM cells in a sector to sense amplifiers 122 during a read operation. For example, a sector select circuit 140 for column 0 of sector A 131 may be used as a switch to couple the NVM cells of column 0 of sector A to sense amplifiers 122 during a read operation.

It should be appreciated that terms "rows" and "columns" of a memory array are used for purposes of illustration, rather than limitation. In one embodiment, rows are arranged horizontally and columns are arranged vertically. In another embodiment, rows and columns of memory array 112 may be arranged in any orientation.

In one embodiment, an NVM cell may be a two transistor (2T) memory cell. In a 2T memory cell, one transistor may be a memory transistor, while another transistor may be a pass transistor. In other implementations the NVM cell may include another number of transistors, such as a single memory transistor (1T), a three transistor memory cell, or otherwise. NVM cells, such as NVM cell 201, 212, 215, and 218 of FIG. 2, will be discussed below in regards to at least FIG. 2-4.

In one embodiment, memory array 112 may be implemented using charge trapping memory transistors. Charge trapping memory transistors may be implemented to utilize transistors and gate structures that include a charge trapping layer. The charge trapping layer may be an insulator that is used to trap charge. The charge trapping layer may be programmed to store data based on voltages applied to or received by the memory array 112. In this way, a memory array 112 may include various different NVM cells arranged in rows and columns, and each NVM cell may be capable of storing at least one data value (e.g., bit). Voltages may be applied to each of the NVM cells to pre-program the NVM cell, program the NVM cell (e.g., program operation—store a logic "1"), erase the NVM cell (e.g., erase operation—store a logic "0"), or read the NVM cell (e.g., read operation). It should be appreciated that memory array 112 may be implemented using different types of memory transistors, such as floating gate memory transistors.

In one embodiment, the charge trapping memory transistors may be implemented using different materials. One example of a charge trapping memory transistor is a silicon-oxide-nitride-oxide-silicon (SONOS) type transistor. In a SONOS type transistor, the charge trapping layer of the memory transistor may be a nitride layer, such as a layer of silicon nitride. Moreover, the charge trapping layer may also include other charge trapping materials such as silicon oxy-nitride, aluminum oxide, hafnium oxide, hafnium aluminum oxide, zirconium oxide, hafnium silicate, zirconium silicate, hafnium oxy-nitride, hafnium zirconium oxide, lanthanum oxide, or a high-K layer. The charge trapping layer may be configured to reversibly trap or retain carriers or holes injected from a channel of the memory transistor, and may have one or more electrical characteristics reversibly changed, modified, or altered based on voltages applied to NVM cell. In another embodiment, different types of charge trapping memory transistors may be used. For purposes of illustration, and not limitation, the operation of NVM cells in the disclosure will be described with respect to a SONOS type transistor. It should be appreciated that other types of NVM transistors may be implemented using the disclosure herein.

Figure 2:
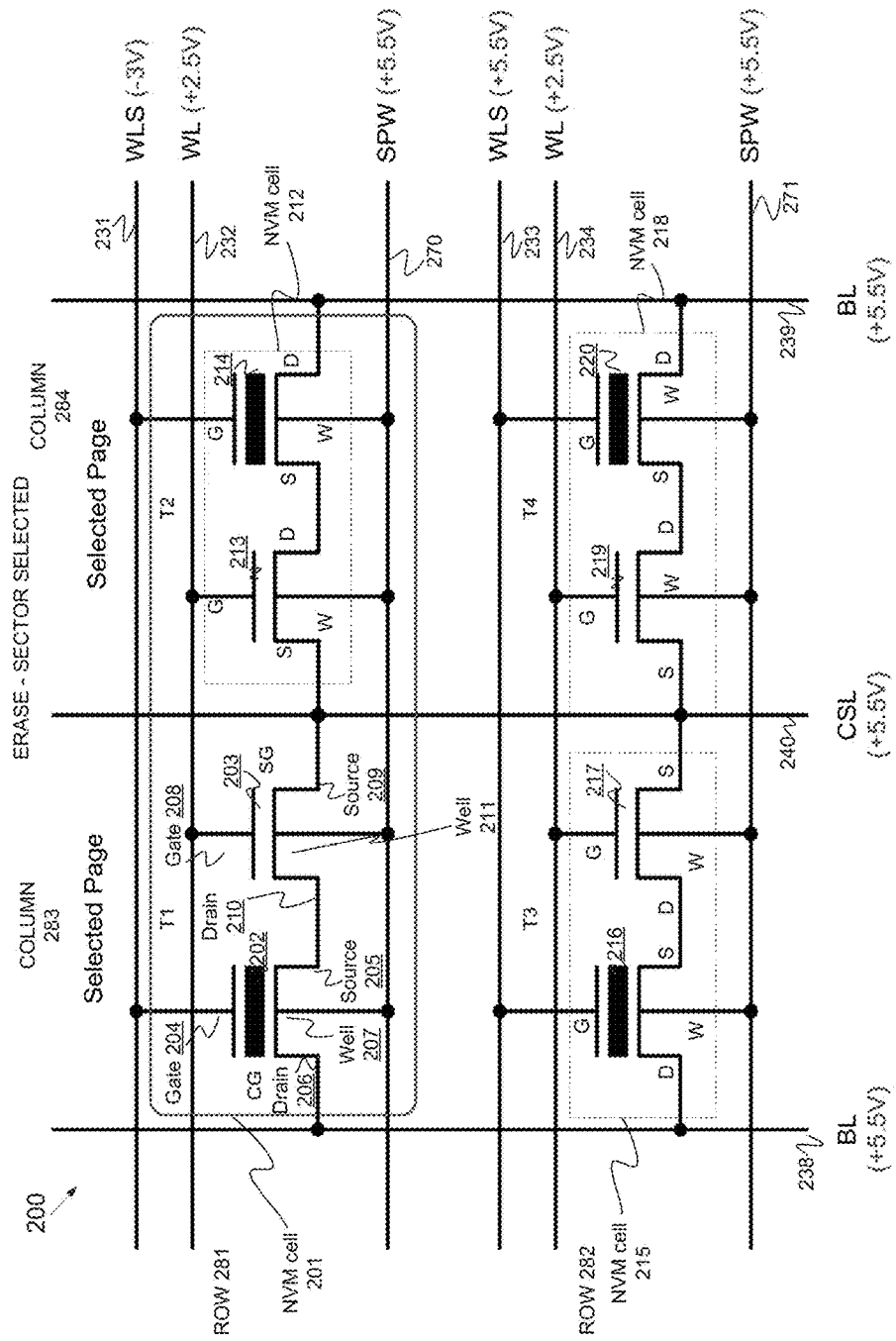
FIG. 2 illustrates a selected sector of a non-volatile memory array during an erase operation, according to one embodiment.

FIG. 2 illustrates a selected sector of a non-volatile memory array during an erase operation, according to one embodiment. NVM sector 200 illustrates various bias voltage levels applied to a selected sector during an erase operation. A selected sector may be a sector of a memory array selected for a particular operation, in this case for an erase operation. During an erase operation, one or more rows of NVM cells of a sector may be erased to read a logical "0". Also during an erase operation, one or more rows of NVM cells of a selected sector may not be erased (e.g., deselected row of selected sector). For example, FIG. 2 illustrates bias voltage levels to erase row 281, but not erase row 282.

NVM sector 200 contains two rows, row 281 containing NVM cell 201 and NVM cell 212, and row 282 containing NVM cell 215 and NVM cell 218. NVM sector 200 contains two columns, column 283 and column 284, which share CSL 240. It should be appreciated that for purposes of illustration, and not for limitation, NVM sector 200 is shown with two rows and two columns. An NVM sector may include the same, more, or less rows and the same, more, or less columns than illustrated in FIG. 2.

Figure 3:
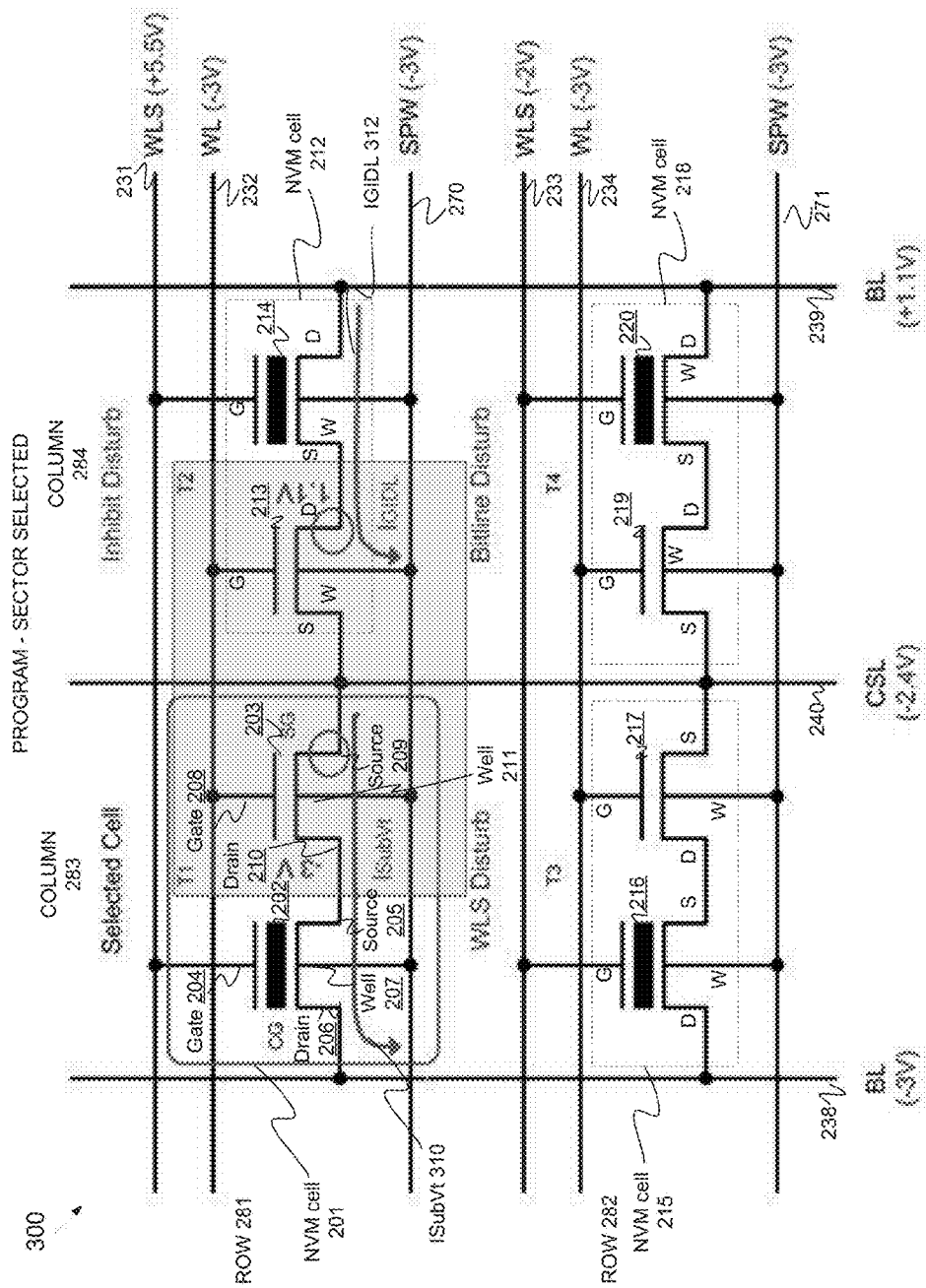
FIG. 3 illustrates a selected sector of a non-volatile memory array during a program operation, according to one embodiment.
Figure 4:
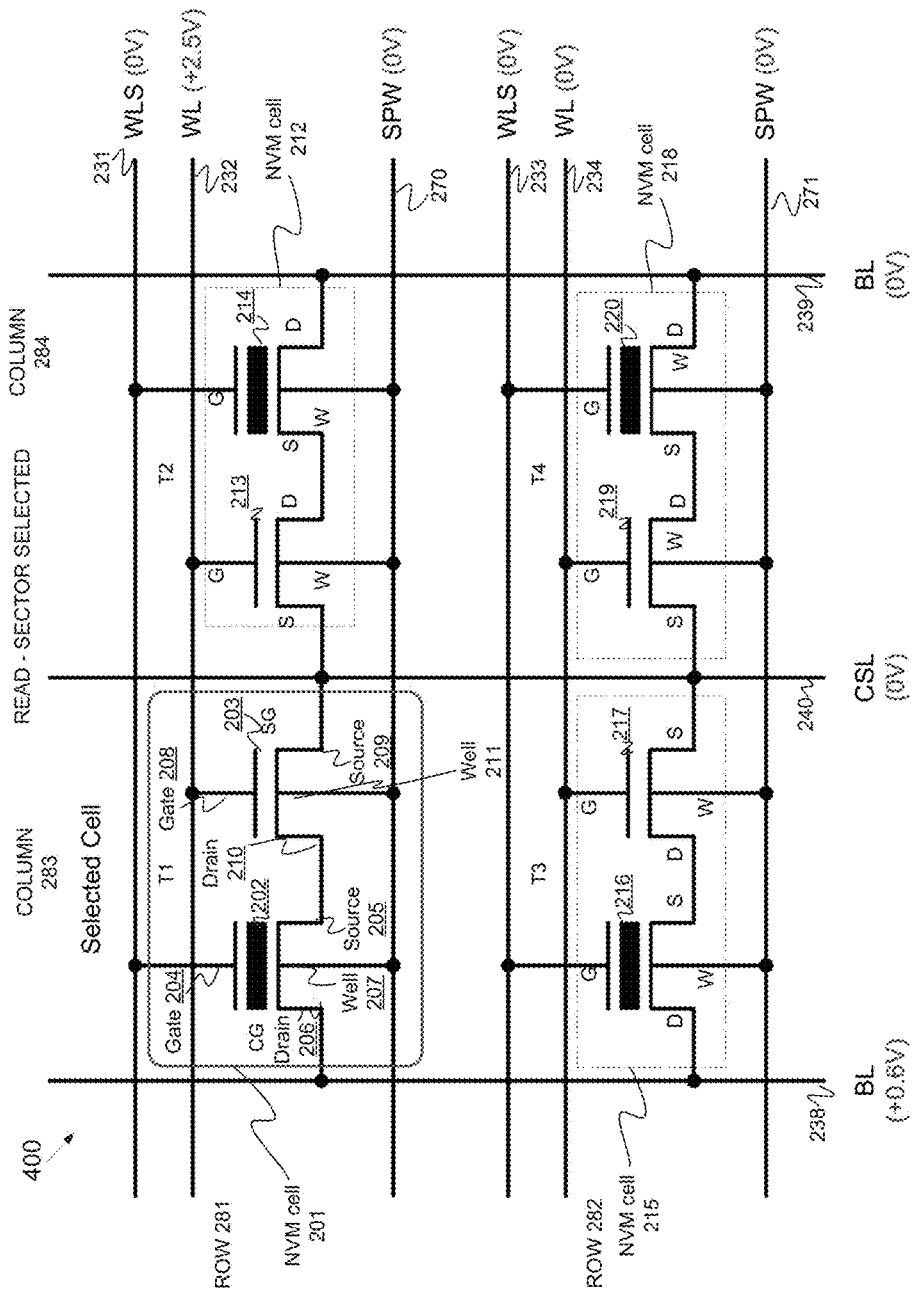
FIG. 4 illustrates a selected sector of a non-volatile memory array during a read operation, according to one embodiment.

NVM sector 200 illustrates multiple horizontal (row) signal lines and multiple vertical (column) signal lines. Horizontal signal lines include lines 231 (WLS), 232 (WL), 270 (SPW), 233 (WLS), 234 (WL), and 271 (SPW). Vertical signal lines include lines 238 (BL) and 239 (BL). Another signal line, the common source line (CSL) 240, is shared by all the NVM cells of column 283 and column 284, including NVM cell 201, NVM cell 212, NVM cell 215, and NVM cell 218. Well lines 270 (SPW), 271 (SPW) may be coupled to a well, such as a P-well or an N-well, of the transistors. A well may be a material doped with p-type and/or n-type ions. A well may be isolated from the substrate (also referred to as the bulk). For example, the well lines may be coupled to a P-well of a transistor. In another embodiment, the well lines may be coupled to the substrate (which may be coupled to the well). It should be appreciated that the voltages applied to the signal lines, as illustrated in FIG. 2 through FIG. 4, may be electrically coupled to, applied by, controlled by, and/or sourced by voltage control circuitry 126 of FIG. 1.

The NVM cells 201, 212, 215, and 218 are 2T NVM cells that include a memory transistor and a pass transistor. NVM cell 201 includes memory transistor 202 and pass transistor 203. The pass transistors may be asymmetric pass transistors. NVM cell 212 includes memory transistor 214 and pass transistor 213. NVM cell 215 includes memory transistor 216 and pass transistor 217. NVM cell 218 includes memory transistor 220 and pass transistor 219. The transistors of the NVM cells 201, 212, 215 and 218 may be 4-terminal transistors and include a gate (G)(e.g., gate region), a source (S) (e.g., source region), a drain (D)(e.g., drain region), and a well (W)(e.g., well region). For example, memory transistor 202 of NVM cell 201 includes gate 204, source 205, drain 206, and well 207. Pass transistor 203 of NVM cell 201 includes gate 208, source 209, drain 210, and well 211. Pass transistors 203, 213, 217, and 219 may be metal-oxide semiconductor field-effect transistors (MOSFET), such as N-channel MOSFET. Memory transistors 202, 214, 216, and 220 may be n-type memory transistors. For purposes of illustration, and not limitation, pass transistors 203, 213, 217, and 219 and memory transistors 202, 214, 216, and 220 are described as n-type transistors. In other implementation some or all of the pass transistors and or memory transistors may be p-type transistors. Additionally, it should be appreciated that p-type transistors may have different bias voltages and different polarity of voltage potentials as those depicted in FIGS. 2-4.

In one embodiment, multiple voltage signals may be applied to NVM sector 200 to perform the erase operation. A power supply, such as external power supply 150 in conjunction with a charge pump, may supply the voltage signals. It should be appreciated voltage levels of the voltage signals are for purposes of illustration rather than limitation, and may be any voltage level and or may be dependent on the particular technology node. WLS 231 is at −3V and connects to the gate 204 of memory transistor 202 and the gate of memory transistor 214. WL 232 is at 2.5V and connects to the gate 208 of pass transistor 203 and gate of pass transistor 213. SPW 270 is at 5.5V and connects to the wells of all the transistors of row 281. WLS 233 is at 5.5V and connects to the gate of memory transistor 216 and the gate of memory transistor 220. WL is at 2.5V and connects to the gate of pass transistor 217 and the gate of pass transistor 219. SPW 271 is at 5.5V and connects to the well of all the transistors of row 282. BL 238 is 5.5V and connects to the drain 206 of memory transistor 202 and the drain of memory transistor 216. CSL 240 is at 5.5V and connects to the source 209 of pass transistor 203, and the sources of pass transistor 213, 217, and 219. BL 239 is at 5.5V and connects to the drain of memory transistor 214 and memory transistor 220.

In one embodiment, the memory transistors 202, 214, 216, and 220 may be NVM transistors, such as charge trapping memory transistors. Memory transistors 202, 214, 216, and 220 are illustrated having a shaded oxide layer In one embodiment, the source region of pass transistors 203, 213, 217, and 219 have halo implants (not shown). Halo implants are illustrated further with respect to FIG. 5. In one example, pass transistors 203, 213, 217, and 219 are n-type transistors and have halo implants of p-type that surround the source region (e.g., junction) that is shared by adjacent pass transistors (e.g., pass transistor 203 shares a source region with pass transistor 213, and pass transistor 217 shares a source region with pass transistor 219). The drains of pass transistors 203, 213, 217, and 219 do not have a halo implant and are of n-type material. The source regions of pass transistors 203, 213, 217, and 219 are connected to CSL 240.

During an erase operation to erase an NVM cell 201 of row 281 of a selected sector, the voltage differential between the gate 204 relative the well 207 of memory transistor 202 is −8.5V, which causes holes to be injected from the channel into the charge trapping layer of memory transistor 202. The erase of memory transistor 202 causes NVM cell 201 to read as a logical "0." Similarly, NVM cell 212 is erased. During the erase operation, NVM cells 215 and 218 of row 282 are not erased as row 282 has been deselected and the voltage between the gate and bulk of memory transistor 216 and memory transistor 220 is 0V.

It should be appreciated that some of the different voltage levels and electrical connections illustrated in FIGS. 2-4 may not be described herein. A person of reasonable skill in the art would be able to determine the different voltage levels and electrical connections in view of the Figures herein, in particular FIG. 2-4. Further, it should also be appreciated that, apart from the relative voltage levels of different signal lines, the description with respect to FIG. 2 applies to FIGS. 3-4, unless otherwise described.

FIG. 3 illustrates a selected sector of a non-volatile memory array during a program operation, according to one embodiment. During a program operation on a selected NVM sector 300, one or more NVM cells (e.g., NVM cell 201) of a selected row 281 may be programmed to a logical "1" while the remaining NVM cells (e.g., NVM cell 212) on the selected row 281 may be inhibited from being programmed and remain erased. The NVM cells 215 and 218 of deselected rows, such as row 282 may be prevented from changing previously stored data values. A write operation may include both an erase operation and a program operation.

In NVM sector 300, NVM cell 201 is illustrated as being in selected row 281 and being programmed. NVM cell 212 is illustrated as being inhibited during the program operation. Leakage currents occurring during the program operation are illustrated as subthreshold leakage current 310 and gate-induced drain leakage current 312. During programming mode, to program NVM cell 201, the voltage signal on BL 238 is −3V, the voltage signal on WLS is 5.5V, and the voltage signal on SPW 270 is −3V. A positive voltage potential is developed across the gate 204 and well 207, and gate 204 and drain 206 of memory transistor 202. During programming mode, to inhibit NVM cell 212, voltage control circuitry 126 of FIG. 1 controls the voltage signal on BL 239 to be 1.1V. NVM cell 215 and 218 are illustrated as being in a deselected row 282 during a program operation.

During a program operation to program NVM cell 201, the voltage across the gate 204 relative to the well 207 and drain 206 of memory transistor 202 is 8.5V. The 8.5V differential injects electrons from the channel of memory transistor 202 into the charge trapping layer which causes memory transistor 202 to be programmed to a logical "1." Also during the program operation to program NVM cell 201, a voltage signal of −3V is applied to WL 232 which is coupled to the gate 208 of pass transistor 203 and the gate of pass transistor 213. A voltage signal of −2.4V is applied to CSL 240 which is coupled to the source of pass transistor 203, 213, 217, and 219.

During the program operation, NVM cell 212 may be inhibited rather than programmed. To inhibit NVM cell 212 during a program operation, voltage control circuitry 126 couples a voltage signal of 1.1V to BL 239. Halo implants at the source of pass transistor 203 and pass transistor 213 reduce the subthreshold leakage current 310. In one example, subthreshold leakage current 310 may be reduced from 100 pico amperes (pA) to 10 pA, or a 10× reduction. The gate-induced drain leakage current 312 may be optimized, for example during the design of NVM sector 300. Gate-induced drain leakage current 312 of NVM cell 212 may remain substantially unchanged. (e.g., unchanged from between NVM devices implementing symmetric pass transistors). The implementation of asymmetric pass transistor may increase the VT of the pass transistor 203 and 213, for example. NVM device implementing asymmetric pass transistors may not incur the trade-off of decreasing subthreshold leakage current 310, while increasing gate-induced drain leakage current 312. For example, if instead of using an asymmetric pass transistor the subthreshold leakage is reduced by increasing channel doping, the GIDL current may increase significantly (e.g., up to 100 pA). The pass transistors 203, 213, 217, and 219 are described as asymmetric pass transistors. It should be appreciated that all, some, or none of the pass transistors of NVM sector 300 may be asymmetric.

FIG. 4 illustrates a selected sector of a non-volatile memory array during a read operation, according to one embodiment. During a read operation of a selected NVM sector 400, the logical values of one or more NVM cells may be read. During a read operation of selected NVM sector 400, the gates of the memory transistors 202, 214, 216, and 220 may be grounded. An erased memory transistor may have a current flow during the read operation. The current is sensed by sense amplifiers 122 of FIG. 1, which registers a logical "0" for the particular NVM cell. A programmed memory transistor has substantially no current flowing during a read operation. Sense amplifiers 122 will sense substantially no current from the programmed NVM cell and register a logical "1" for the particular NVM cell.

During the read operation of NVM cell 201, a voltage signal of 2.5V may be applied to WL 232 and coupled to the gate 208 of pass transistor 203 and the gate of pass transistor 213, while 0V may be applied to CSL 240. 0V may also be applied to WLS 231 coupled to the gate 204 of memory transistor 202 and the gate of memory transistor 214. Voltage on BL 238 may fluctuate from 0V to 0.6V, depending on whether the read NVM cell is a logical "0" or "1."

Figure 5:
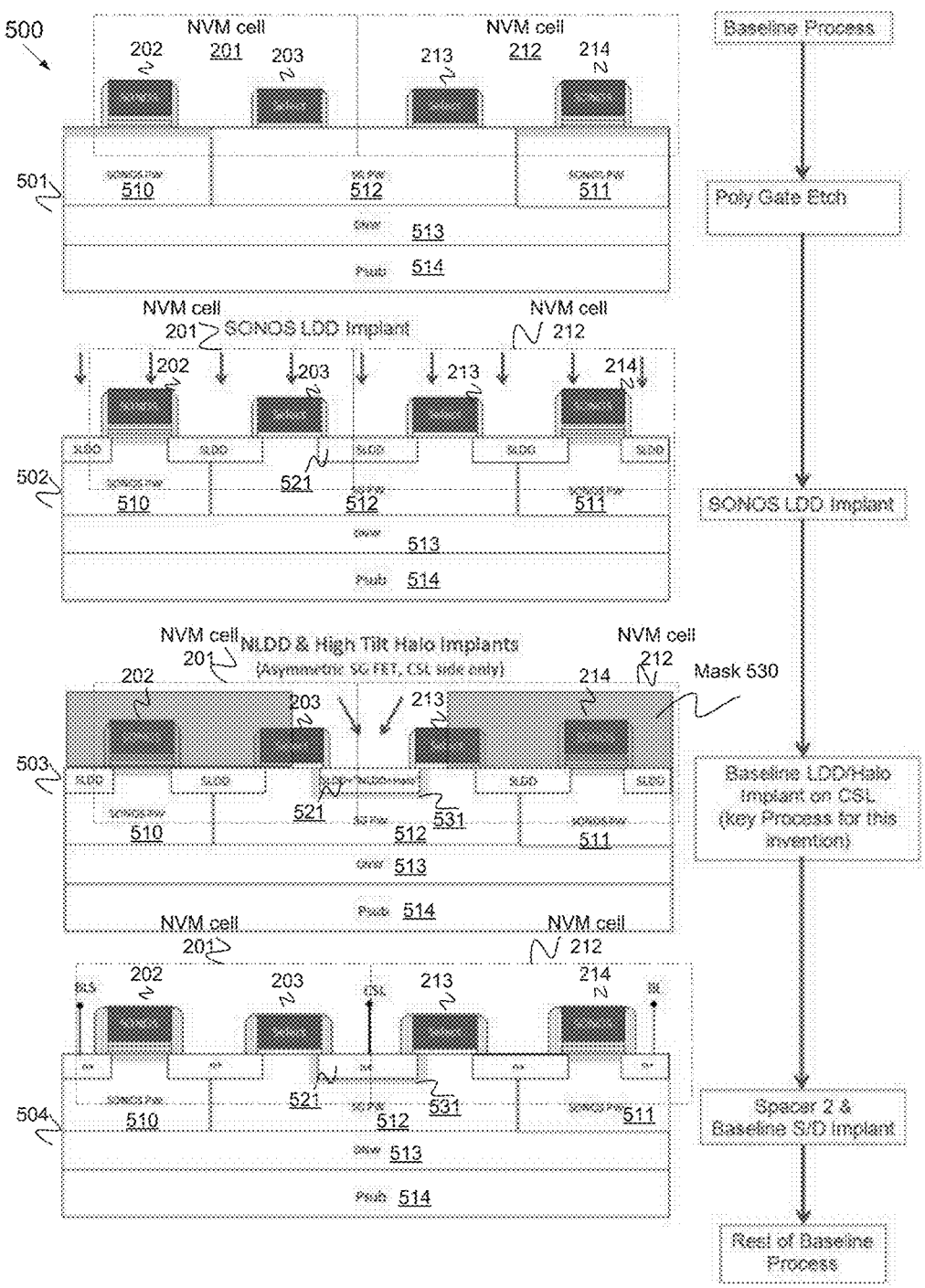
FIG. 5 illustrates a fabrication process of a non-volatile memory array that includes an asymmetric pass transistor, according to one embodiment.

FIG. 5 illustrates a fabrication process of a non-volatile memory array that includes an asymmetric pass transistor, according to one embodiment. Baseline fabrication process 500 illustrates process 501, 502, 503, and 504 (also referred to as operation). It should be appreciated that baseline fabrication process 500 is provided for purposes of illustration rather than limitation. Baseline fabrication process may include the same, more, or less processes, and or processes in a different order.

Process 501 may be subsequent additional fabrication (not shown) processes of baseline fabrication process 500. Process 501 illustrates two NVM cells, NVM cell 201 and 212. NVM cell 201 includes memory transistor 202 and pass transistor 203 and NVM cell 212 includes memory transistor 214 and pass transistor 213. NVM cell 201 and 212 are further described with respect to FIGS. 2-4. Well 510 and well 511 may be p-type wells and are under memory transistor 202 and 214, respectively. Well 512 may be a p-type well and is under and is shared by pass transistor 203 and 213. Process 501 illustrates pass transistor 203 and 213 as symmetric pass transistors. Well 513 (also referred to as deep n-well) is beneath the wells of the preceding layer and may be an n-type well. Substrate 514 may be a p-type substrate. Process 501 may be a poly gate etch process related to the formation of the gates of the transistors for NVM cell 201 and 212. Process 502 may be a lightly doped drain process (SLDD) that implants n-type ions into source and drain regions of the transistors of NVM cell 201 and 212. Shared source region 521 is shared between pass transistor 203 and 213 and receives n-type implants.

Process 503 may be also be a lightly doped drain process (NLDD) that implants n-type ions into the source region (e.g., shared source region 521) of the pass transistor 203 and 213.) In one embodiment, in SLDD and NLDD the implant doses and energy may be different and may be optimized for each region (e.g., source and drain of a transistor). The NLDD implant may be part of the baseline fabrication process 500 and use mask 530 as part of the implantation process. Process 503 of baseline fabrication process 500 may leverage the mask of the NLDD implant to perform a halo implant 531 around the shared source region 521 of pass transistor 203 and 213, without implanting halo implants in other regions, such as the drain region of pass transistor 203 and 213. The halo implant 531 may be high-tilt halo implants that are performed at an angle so the halo implant 531 is implanted at least partially under the gate of pass transistor 203 and 213. Halo implant 531 may be a p-type material. The implantation of halo implant 531 is performed at the CSL side of the NVM cell 201 and NVM cell 212, and not performed at the drain region of pass transistor 203 and 213 (or a lightly doped halo implant at the drain region of pass transistor 203 and 213), making pass transistor 203 and 213 asymmetric pass transistors. Halo implant 531 may leverage mask 530 of an existing process (NLDD) without adding an additional process step to baseline fabrication process 500. In another embodiment, an additional mask (not shown) and or process step may be used to implant halo implant 531.

In one embodiment, in process 502 the drain region and source region of both memory transistor 202 and 214 and pass transistor 203 and 213 are lightly doped with an n-type implant dose in the range of $1.0 \times 10^{13}$ to $1.0 \times 10^{14}$ atoms per cm2 (which may be optimized for SONOS performance). At process 503, an additional n-type LDD (NLDD) implant with an implant dose level in the range of $1.0 \times 10^{14}$ to $1.0 \times 10^{15}$ atoms per cm2 and p-type halo implant 521 (opposite dopant type of LDD implant) with an implant dose of $1.0 \times 10^{13}$ atoms per cm2 to $1.0 \times 10^{14}$ (e.g., strongly doped halo implant) and a tilt angle of 30 to 45 degree will be added into the asymmetric source side (e.g., shared source region 521) by modifying the existing implant mask. The additional NLDD implant and halo implant 521 may be one of baseline implants normally optimized for a core CMOS region.

Process 504 may add one or more spacers between the gates of the transistors on NVM cell 201 and NVM cell 212 and add n-type ions to the source and drain regions of the transistors on NVM cell 201 and NVM cell 212. Additional subsequent steps may be added to baseline fabrication process 500.

In one embodiment, baseline fabrication process 500 includes implanting a first material of a first conductivity type at a source 521 of a pass transistor 201 of a two-transistor (2T) non-volatile memory (NVM) cell 201, wherein the 2T NVM cell 201 includes a memory transistor 202 and the pass transistor 203. Baseline fabrication process 500 further includes implanting a second material of a second conductivity type around at least part of the source 521 of the pass transistor 2013 to form a halo implant 531. The first conductivity type of the first material and the second conductivity type of the second material are opposite conductivity types. The pass transistor 203 is an asymmetric transistor. In one embodiment, asymmetric pass transistor 203 includes a source 521 with the halo implant 531 and a drain without the halo implant. Baseline fabrication process 500 may include forming a common source line (CSL) coupled to the source 521 of the pass transistor 203. The CSL is shared among NVM cells of a sector of NVM cells. In another embodiment, the first material is implanted at the source 521 of the pass transistor 203 by forming a lightly doped drain (LDD) at the source 521 of the pass transistor 203. In another embodiment, a same mask is used during the implanting of the first material and the implanting the second material.

Figure 6:
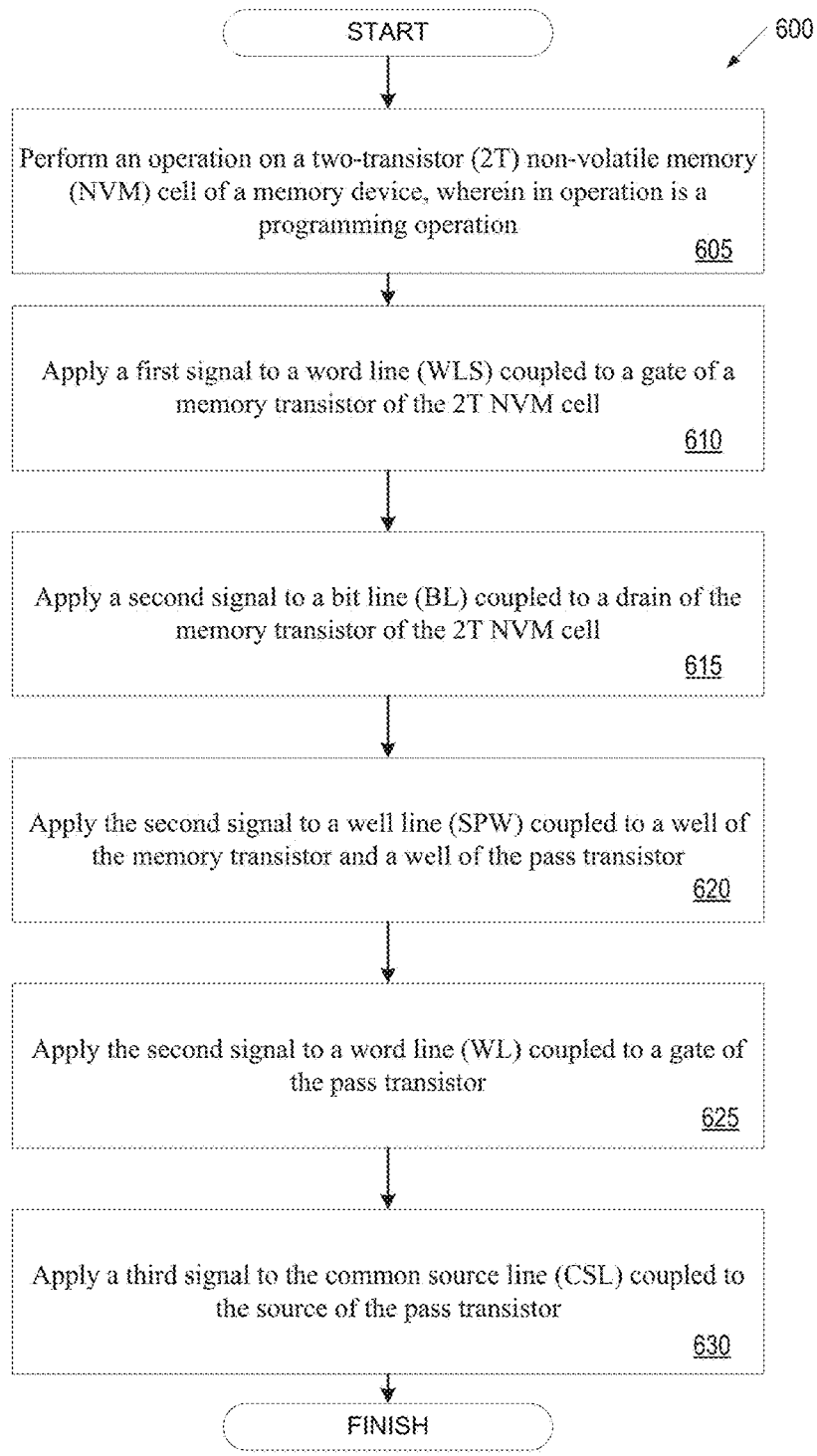
FIG. 6 is a flow diagram illustrating a program operations performed on an non-volatile memory cell, according to an embodiment.

FIG. 6 is a flow diagram illustrating a program operations performed on an non-volatile memory cell, according to an embodiment. It should be appreciated that other operation may be performed, such as a pre-program, an erase operation, a program operation, and a read operation. It should be appreciated that only some of the voltage signals are described for each operation. Additional voltage signals for other operations are described in regards to FIGS. 2-4. It should also be appreciated that features of FIG. 1-5 may be described below to help illustrated method 600. Method 600 may be performed by processing logic that comprises hardware (e.g., circuitry, dedicated logic, programmable logic, microcode), software (e.g., instructions run on a processing device to perform hardware simulation), or a combination thereof. In one embodiment, processing device 104 and/or part or all of non-volatile memory device 102, such as /voltage control circuitry 126, as shown in FIG. 1 may perform some or all the operations described herein.

Method 600 begins at block 605 where processing logic performing the method performs an operation on a 2T NVM cell, such as NVM cell 201, of NVM device 102. The operation may be a program operation illustrated with respect to FIG. 3. The pass transistor 203 of NVM cell 201 is an asymmetric transistor, for example an asymmetric transistor having a halo implant at source 209 and no halo implant at drain 210. Pass transistor 203 is coupled to CSL 240 which is shared with NVM cell 201, 212, 215, and 218. At block 610, programming logic applies a voltage signal to WLS 231 of 5.5V. WLS 231 is coupled to gate 204 of memory transistor 202 of NVM cell 201. At block 615, programming logic applies a voltage signal to BL 238 of −3V. BL 238 is coupled to drain 206 of memory transistor 202 of NVM cell 201. At block 620, programming logic applies a voltage signal to SPW 270 of −3V. SPW 270 is coupled to well 207 of memory transistor 202 of NVM cell 201. A positive voltage potential of 8.5V is formed between gate 204 and drain 206 and between gate 204 and well 207 of memory transistor 202 to program NVM cell 201. At block 625, processing logic applies a voltage signal to WL 232 of −3V. WL 232 is coupled to the gate 208 of pass transistor 203 of NVM cell 201. At block 630, processing logic applies a voltage signal to CSL 240 of −2.4V. The CSL 240 is coupled to the source 209 of pass transistor 203. The voltage potential between gate 208 and source 209 of pass transistor is −0.6V, which is below the threshold voltage of pass transistor 203. The threshold voltage of pass transistor 203 may be approximately 0.6V.

It should be appreciated that although a program operation has been provided above, other operations may be performed on a sector of NVM cells implementing asymmetric pass transistors. For example, as illustrated in FIG. 2, an erase operation may be performed on NVM cell 201 by processing logic applying a voltage signal to SPW 270 of 5.5V. SPW 270 is coupled to well 207 of memory transistor 202 and well 211 of pass transistor 203 of NVM cell 201. A negative voltage potential is formed between gate 204 and well 207 and between gate 204 and drain 206 of memory transistor 202 to erase (logical "0") NVM cell 201 (as well as erase NVM cells of row 281). In another example, as illustrated in FIG. 4, a read operation may be performed on NVM cell 201. Processing logic may apply a voltage signal to WL 232 of 2.5V. WL 232 is coupled to gate 208 of pass transistor 203 of NVM cell 201. Processing logic may apply a voltage signal to CSL 240 of 0V (e.g., ground voltage). A positive voltage may be coupled between the gate 208 and source 209 of pass transistor 203 to turn "on" the pass transistor (e.g., a voltage above the VT of pass transistor 203).

Figure 7:
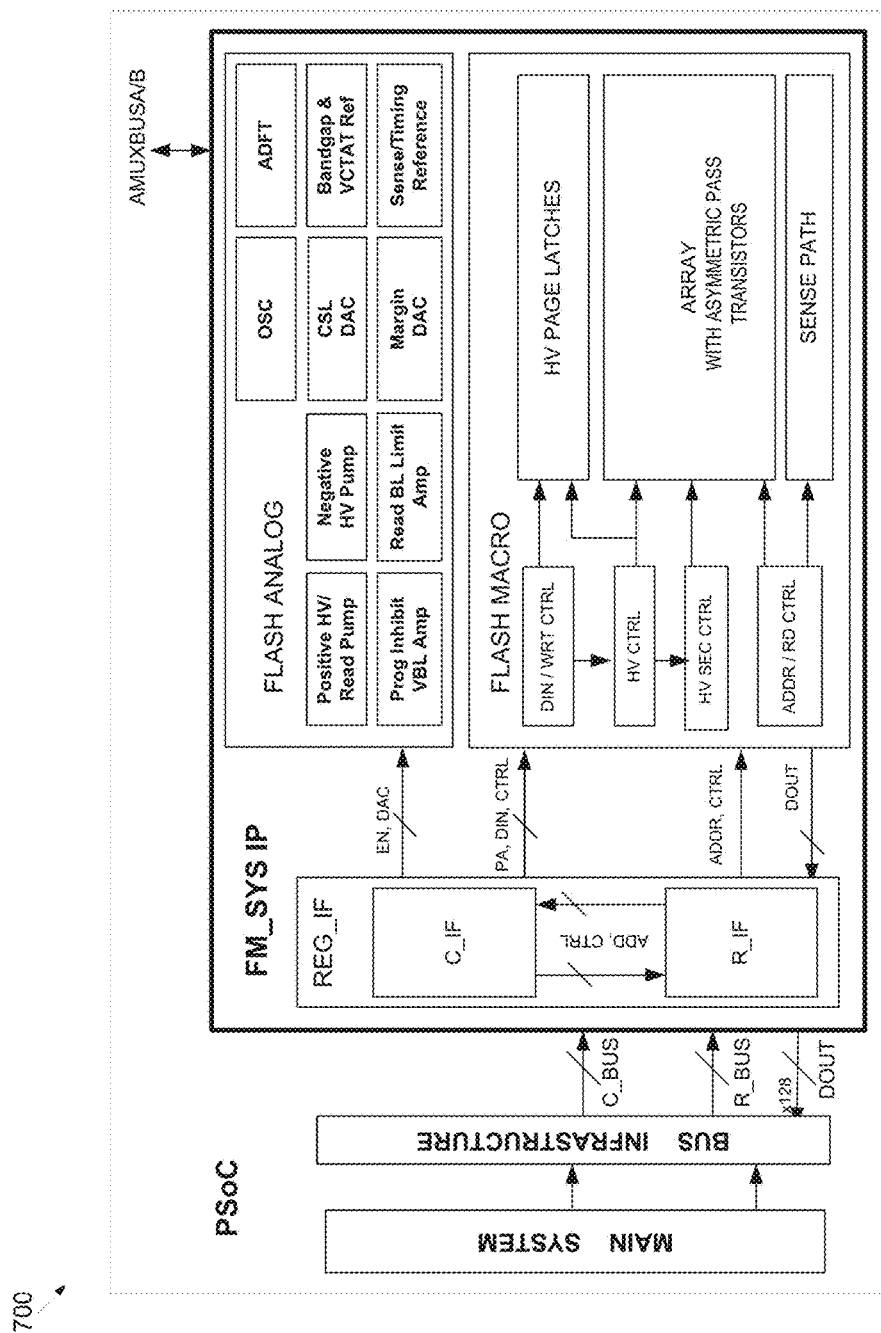
FIG. 7 is a block diagram illustrating a non-volatile memory system, according to another embodiment.

FIG. 7 is a block diagram illustrating a non-volatile memory system, according to another embodiment. Circuit 700 is another NVM system in which the current disclosure may operate. Circuit 700 includes a memory array with asymmetric pass transistors.

Embodiments of the present invention include various operations described herein. These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. The terms "first," "second," "third," "fourth," etc. as used herein are meant as labels to distinguish among different elements and may not necessarily have an ordinal meaning according to their numerical designation.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A memory device, comprising:
a first non-volatile memory (NVM) cell including a first memory transistor and a first pass transistor;
a second non-volatile memory (NVM) cell including a second memory transistor and a second pass transistor; and
a common source line (CSL) coupled with at least a source of one of the first and second pass transistors, wherein at least one of the first and second pass transistors is an asymmetric transistor.

2. The memory device of claim 1, wherein the asymmetric transistor includes a source and a drain having different doped regions.

3. The memory device of claim 1, wherein the source of at least one of the first and second pass transistors includes a halo implant.

4. The memory device of claim 1, wherein a drain of at least one of the first and second pass transistors includes a halo implant.

5. The memory device of claim 1, wherein both the source and a drain of at least one of the first and second pass transistors include a halo implant, wherein the halo implant of the source of the at least one of the first and second pass transistors is different from the halo implant of the drain.

6. The memory device of claim 4 wherein the halo implant surrounds at least a portion of the source of the at least one of the first and second pass transistors.

7. The memory device of claim 5, wherein the halo implants of the source and drain of the at least one of the first and second pass transistors comprises a dopant of a same conductivity type.

8. The memory device of claim 7, wherein an implant dose of the dopant in the halo implant of the source of the at least one of the first and second pass transistors is greater than the halo implant of the drain.

9. The memory device of claim 1, wherein the first and second memory transistors are charge trapping transistors.

10. The memory device of claim 4 wherein the halo implant is a high-tilt halo implant.

11. A method comprising:
performing an operation on a non-volatile memory (NVM) cell of a memory device, wherein a pass transistor of the NVM cell is an asymmetric transistor, wherein a source of the pass transistor is coupled to a common source line (CSL) that is shared among NVM cells of a sector of NVM cells, and wherein the operation comprises:
applying a first signal to a word line (WLS) coupled to a gate of a memory transistor of the NVM cell; and
applying a second signal to a bit line (BL) coupled to a drain of the memory transistor of the NVM cell.

12. The method of 11, wherein the asymmetric transistor includes a source and a drain having different doped regions.

13. The method of 11, wherein the asymmetric transistor includes the source including a halo implant.

14. The method of claim 11, wherein the operation is a programming operation to program the NVM cell, wherein the operation further comprises:
applying the second signal to a well line (SPW) coupled to a well of the memory transistor and a well of the pass transistor, wherein the first signal and the second signal form a positive voltage potential between the gate and the drain of the memory transistor and between the gate and the well of the memory transistor.

15. The method of claim 11, wherein the operation is a programming operation to program the NVM cell, wherein the operation further comprises:
applying the second signal to a word line (WL) coupled to a gate of the pass transistor; and
applying a third signal to the common source line (CSL) coupled to the source of the pass transistor, wherein the second signal and the first signal form a voltage potential between the gate and the source of the pass transistor that is below a threshold voltage of the pass transistor.

16. The method of claim 11, wherein the operation is an erase operation to erase the NVM cell, wherein the operation further comprises:
applying the second signal to a well line (SPW) coupled to a well of the memory transistor and a well of the pass transistor, wherein the first signal and the second signal form a negative voltage potential between the gate and the drain of the memory transistor and between the gate and the well of the memory transistor.

17. The method of claim 11, wherein the operation is a read operation to read the NVM cell, wherein the operation further comprises:
applying a fourth signal to a word line (WL) coupled to a gate of the pass transistor; and
applying a fifth signal to the CSL coupled the source of the pass transistor, wherein the fourth signal and the fifth signal form a positive voltage potential between the gate and the source of the pass transistor.

18. A system, comprising:
a non-volatile memory (NVM) array comprising a plurality of NVM cells, wherein an NVM cell of the plurality of NVM cells comprises,
a memory transistor,
a pass transistor coupled to the memory transistor, wherein the pass transistor of the NVM cell is an asymmetric transistor, and
a common source line (CSL) coupled to the source of the pass transistor, wherein the CSL is shared among NVM cells of a sector of NVM cells of the NVM array; and
voltage control circuitry configured to generate and control voltage signals for operation of the NVM array, wherein the voltage signals include high voltage signals and low voltage signals for pre-program, erase, program, and read operations.

19. The system of claim 18, wherein the asymmetric transistor includes one of a source or a drain that has a halo implant.

20. The system of claim 19, wherein the asymmetric transistor includes the source having the halo implant.

* * * * *